(12) United States Patent
Wandel et al.

(10) Patent No.: US 6,306,224 B1
(45) Date of Patent: Oct. 23, 2001

(54) PROCESS AND DEVICE FOR TREATMENT OF SHEET OBJECTS IN A LIQUID BATH

(75) Inventors: Gernot Wandel, Blaubeuren-Steigziegelhütte; Fritz Heyer, Wedel; Berthold Schum, Biebergemünd, all of (DE)

(73) Assignee: Angewandte Solarenergie-ASE GmbH, Alzenau (DE)

( * ) Notice: Subject to any disclaimer, the term of this patent is extended or adjusted under 35 U.S.C. 154(b) by 0 days.

(21) Appl. No.: 09/348,303

(22) Filed: Jul. 7, 1999

(30) Foreign Application Priority Data

Jul. 7, 1998 (DE) .............................. 198 30 212

(51) Int. Cl.[7] .................. B08B 1/02; B08B 3/04
(52) U.S. Cl. ................ 134/32; 134/33; 134/42; 134/66; 134/159
(58) Field of Search ............... 134/33, 15, 23, 134/42, 66, 67, 157, 158, 159, 32

(56) References Cited

U.S. PATENT DOCUMENTS 5,261,207   11/1993   Bedin ..................... 53/284.5
5,356,481 * 10/1994   Yoshimura et al. ......... 134/22.1
5,494,529 *  2/1996   Ciccarelli et al. .......... 134/15

FOREIGN PATENT DOCUMENTS

| 639104 | 11/1936 | (DE) . |
| 1951204 | 10/1969 | (DE) . |
| 7316859 | 8/1973 | (DE) . |
| 3543286 | 12/1985 | (DE) . |
| 4038587 | 6/1992 | (DE) . |
| 0070694 | 1/1983 | (EP) . |
| 0637561 | 2/1995 | (EP) . |
| 1032599 | 6/1953 | (FR) . |
| 1032284 | * 6/1966 | (GB) ................. 134/159 |

* cited by examiner

Primary Examiner—Randy Gulakowski
Assistant Examiner—Saeed Chaudhry
(74) Attorney, Agent, or Firm—Dennison, Scheiner, Schultz & Wakeman

(57) ABSTRACT

A process and device for treating sheet objects, especially fragile sheet objects, by rotation through a liquid bath. The objects are disposed in radial slots in a rotating disk, retained therein by a flexible element moving synchronously with the disk, and by a retaining element mounted adjacent the disk and spaced therefrom along its axis of rotation.

28 Claims, 2 Drawing Sheets

PROCESS AND DEVICE FOR TREATMENT OF SHEET OBJECTS IN A LIQUID BATH

DESCRIPTION

Process and device for treatment of objects, in particular disk-like objects such as metal sheets, glass panes, PCBs and ceramic substrates

BACKGROUND OF THE INVENTION

The invention relates to a process for treatment of objects, in particular disk-like objects such as metal sheets, glass panes, PCBs and ceramic substrates, where the objects are supplied to a bath containing fluid, rotated by means of a rotation device about the rotational axis of said rotation device with permanent alignment of the objects on said rotational axis, and at the same time transported through the bath and moved away translationally after the bath, with the objects being retained, during their transport through the bath in receptacles of the rotation device that are radial relative to the rotational axis, by a securing element peripherally surrounding said rotation device. The invention also relates to a device for treatment of objects, in particular disk-like objects such as metal sheets, glass panes, PCBs and ceramic substrates, comprising a bath fillable with fluid such as a chemical bath for treatment of the objects, a feed device arranged upstream of the bath, a conveying device passing the objects through the bath in the form of a rotation device with radial receptacles intended for receiving the objects, a securing element provided inside the bath and extending in the peripheral area of the receptacles for retaining the objects in the receptacles, a removal device arranged downstream of the bath, and the washing and/or drying stage arranged downstream of the bath with associated transport device.

In order to treat, for example, oxide layers of semiconductor wafers by etching in diluted hydrofluoric acid, it is known to place the wafers in hurdles made of plastic and then to successively immerse these either manually or with a handling unit in various chemical baths or to spray them with chemicals. The drawback of this procedure is that the placing of the wafers into the hurdles and the removal of the wafer from these hurdles necessitate additional procedural steps which are particularly unwelcome when the processes preceding or following the chemical treatment are to be performed continuously.

A further drawback of the known process is that the supply of chemicals to the wafers being treated is restricted by the hurdles. In addition, fluids like water and residual chemicals can remain in the pockets of the hurdles during drying unless expensive drying processes are used.

In another known process, the wafers are passed by a belt conveyor or transport belt through a spray device in which they are sprayed with chemicals. On the one hand it is not assured by spraying that the wafers are completely wetted, and on the other hand the treatment duration is restricted and/or the necessary equipment must be designed with a very high volume.

DE-PS 639 104 describes a device for the treatment of metal sheets that are passed through a bath filled with liquid. Here the flat objects are picked up by a rotation device and passed through the bath. Downstream of the bath is a transport device with which the objects are moved translationally. The rotation device itself is supplied with the objects from a stack. Furthermore, stationary guide strips run peripherally to a rotation device, along which the metal sheets slide in order to ensure that these metal sheets remain inside the rotation device.

A transport device is known from EP 0 070 694 A1 in which objects such as sockets are transported by means of a rotary plate that is surrounded on the circumferential side by an endless belt. The rotary plate itself is rotatable about a vertically running rotational axis. The objects are moved in the entry area of the rotary plate relative to a fixed guide plate.

A spoked-wheel transport device described in DE-OS 1 951 200 provides for a conveying device in the form of a spoked wheel for cooling slabs.

A process for metallization of the surfaces of flat objects is described in DE 35 43 286 C2. The objects here pass through several cleaning and drying stations.

A device for turning PCBs is known from EP 0 637 561 A1, in which a rotating wheel in the form of a fan-shaped magazine is used. Here the objects are conveyed translationally to the magazine and then inside the latter above the rotational axis.

SUMMARY OF THE INVENTION

The problem underlying the present invention is to develop a process and a device of the type mentioned at the outset such that it is assured in addition to integration in a continuous process that the objects can be treated with the fluid necessary for treatment to the required extent without any damage being incurred. In particular, relative movements between the objects and the rotation device during passage of the objects through the bath are to be prevented.

The problem is solved in accordance with the invention substantially in that the objects are retained in the receptacle during their passage through the bath by a flexible element as a securing element that is moved synchronously with the rotation device, in that the objects are radially supplied to the rotation device via a conveyor belt, and in that the objects are supplied to at least one washing and/or drying stage after leaving the bath. The objects are here placed in receptacles of a rotating conveying device that are radial to the rotational axis, the objects being secured during their passage through the bath on their sides facing away from the rotational axis. The rotary axes themselves can be supplied to the rotating conveying device such as a reversing wheel, or removed from the latter, by a conveyor such as a belt conveyor. They are secured by a flexible element moving synchronously with the rotating conveying device and surrounding the latter peripherally in the lower part, hence preventing a relative movement between the objects and the securing element and thus also preventing otherwise possible damage to thin objects.

In accordance with the invention, transfer of the objects is effected in a continuous or virtually continuous process from a first conveying device such as a belt conveyor to the rotation device, which can be described as a modified reversing wheel, using which the objects are passed through the bath in order to then be transferred to a further translational conveying device such as a conveyor belt. The objects can then be passed on to a washing and/or drying stage.

To ensure in the washing and/or drying stage that all areas of the objects are cleaned and dried to the necessary extent, a further embodiment of the invention provides that the objects are supported during their passage through the washing and/or drying stage at different points in the area of its transport section. In other words, the support points of the objects during their passage through the washing and/or drying stage differ from one another.

To prevent any uncontrolled movement of the objects during their passage through the washing and/or drying stage, it is further provided that the objects are subjected to pressure in the direction of their supports.

A device of the type mentioned at the outset is characterized in that the securing element is a flexible element moving synchronously with the rotation device.

The rotation device here comprises in particular two cheeks at a distance from one another and extending from a common shaft passed through by the axis, said cheeks having slots opened radially towards the periphery relative to the axis and serving as receptacles.

The cheeks themselves are preferably designed as circular discs and have penetrations.

On the outside along each cheek, a lateral retaining element such as a limiting disk mounted on the shaft should be arranged that is preferably connected to the respective cheek. The corresponding retaining elements ensure that the objects are not axially movable inside the slots to an inadmissible extent.

To ensure that the objects cannot slip out of the slots during passage through the bath, the flexible element such as a belt is provided for securing them in accordance with the invention, and covers the receptacle facing away from the axis on the circumferential side along the cheek such as a circular disk. The belt is moved synchronously with the rotation device. Here the flexible element is in particular an endless belt which is guided via deflecting rollers for contact with the cheeks on the edge side inside the bath. Thanks to the synchronous movements, a relative movement between the securing element and the objects during their passage through the bath is not possible. As a result, it is ensured in particular in the case of thin and/or sensitive objects such as glass panes or ceramic substrates that damage or destruction is prevented.

To achieve a high throughput, at least two rotation devices can be mounted on the shaft, with one retaining element each being provided between adjacent cheeks of successive rotation devices. This achieves a simplification of the device as such.

The receptacles designed as radial slots for the objects are in particular arranged on the cheek of the disk and spread out evenly over the periphery. It is also possible for the device to have several baths arranged on a row one behind the other, with rotation devices conveying the objects through these baths.

The feed device to the rotation device, which can be designated as a reversing wheel, and/or the removal device arranged downstream of the rotation device, should be a translational transport device such as a belt conveyor.

To supply the objects from the feed device or removal device to the rotation device, or to remove the objects from the rotation device, the respective transport device can be moved in the area between the side cheeks of the rotation device during supply/removal. After depositing/picking up the objects, the appropriate transport device is then withdrawn.

In particular however, it is provided that the objects are transferred from the feed device onto the rotation device or from the latter onto the removal device by at least one catch parallel to the conveying device and movable back and forth relative thereto, said catch preferably running between the cheeks of a rotation device. For pickup, the catch can furthermore be raised and lowered.

By the use of the catch, which can be designated as a slide, the objects can be slid into or slid out of the rotation device without problems, with the respectively assigned transport devices are arranged at a distance from the peripheral area of the cheeks at the ends. This has the advantage that the catches or slides do not contact the fluid, so that contamination in particular with chemicals by the transport device outside the bath need not be feared.

In the cleaning and/or drying stage arranged downstream of the bath, the objects should also be moved by a translational conveying device such as a belt conveyor or walking-beam conveyor. Each conveying device here is subdivided into conveyor sections on which the objects are supported in various areas. This has the advantage that complete cleaning or drying of the objects during their passage through the cleaning and/or drying stage is assured.

To rule out lateral divergence of the objects, a further embodiment provides that the objects in the transport section are laterally limited by guide elements running parallel to this section.

To prevent lifting of the objects while they are being treated with cleaning fluid and/or drying air, rollers aligned on the conveying device and using which the objects are subjected to pressure can be arranged above the transport section of the cleaning and/or drying stage.

In the transport section of the cleaning stage, spray nozzles aimed at the objects and/or surge-cleaning devices are arranged in order to achieve in simple form the necessary cleaning. Here the cleaning stage itself can be designed in several stages. The cleaning fluid required for each cleaning stage flows in a circuit, with the circuits for identical cleaning fluids being connected in a cascade.

The drying stage itself has in particular air nozzles and knives aligned on the objects to be dried.

To extract fluid, at least one suction device can be assigned to the transport section.

BRIEF DESCRIPTION OF THE DRAWINGS

Further details, advantages and features of the invention are shown not only in the claims and in the features they contain—singly and/or in combination—but also in the following description of preferred embodiments shown in the drawing.

In the drawing.

DESCRIPTION OF THE PREFERRED EMBODIMENTS

Figure 1:
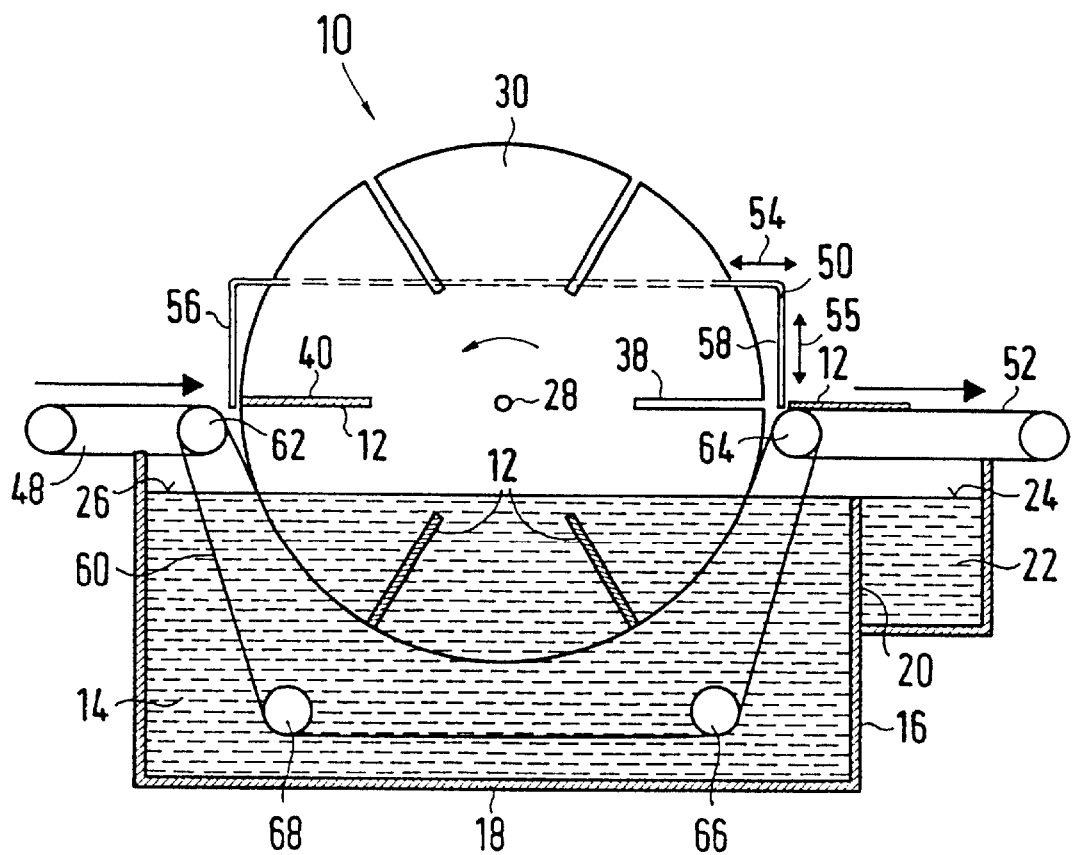
FIG. 1 shows a principle view of a conveying device for conveying flat substrates through a bath.

FIG. 1 shows a principle view of a conveying device 10 using which objects 12 are to be conveyed through a bath 16 containing a fluid 14, in order to etch surfaces, for example. This is possible with, for example, semiconductor wafers as flat objects 12 by means of diluted hydrofluoric acid. However, the teachings in accordance with the invention are not restricted to this, but also extend to objects of any type, in particular however to disk-like objects such as metal sheets, glass panes, PCBs and ceramic substrates.

The bath 16 comprises a basin 18 connected via a partition wall 20 to a supply tank 22, by which the fluid is continuously circulated, the fluid level 24 being defined by the top edge of the partition wall 20. This ensures that the bath 16 always has the same fluid level 26.

Figure 2:
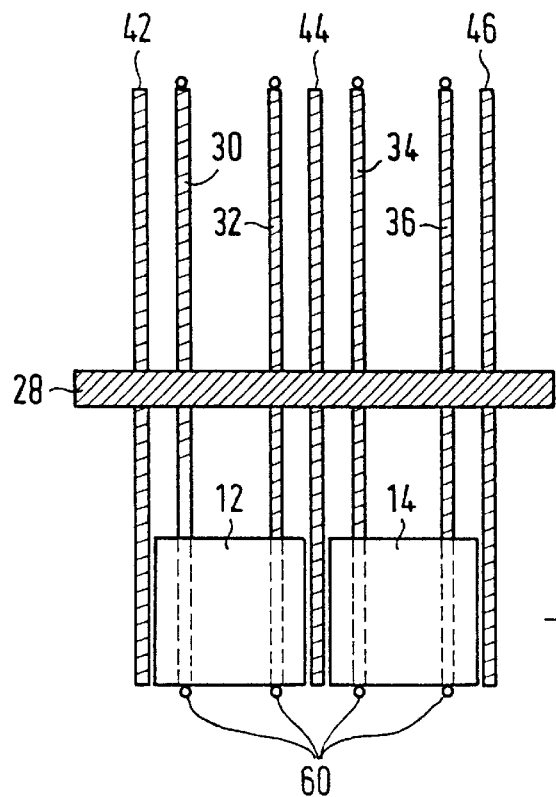
FIG. 2 shows a cross-section through an array comprising several conveying devices according to FIG. 1.

The conveying device 10, which is designed as a reversing wheel, extends into the bath 16, i.e. into the fluid 14. This means that disk-like elements 30, 32 or 34, 36 (FIG. 2) at a distance from one another are mounted on a shaft 28 and are rotatable jointly about the axis determined by the shaft 28. Extending peripherally from the circumference of the disks 32, 34, 36 are radial slots, numbered 38, 40 as an example. The slots 38, 40 are used as receptacles for the objects 12 to be conveyed through the bath 18 and treated there. As the sectional view in FIG. 2 makes clear, there are lateral disk-like retaining or limiting elements 42, 44, 46 on the outside along each disk element 30, 32, 34, 36, which can be designated as cheeks and which ensure that objects 12 present in the slots 38, 40 cannot slip out axially from the slots 38, 40 such that they can no longer be held. Here only one retaining element 44 or disk is provided between conveying devices 10 mounted adjacently on the same shaft 28 and formed by the disks 30, 32 and 34, 36.

The limiting disks 42, 44, 46 should furthermore be connected by webs to the respective cheeks 30, 32, 34, 36. Finally, the cheeks 30, 32, 34, 36 and the retaining disks 42, 44, 46 can have penetrations to the necessary extent.

The openings, not shown in the figures, on the one hand in the disk elements 30, 32, 34, 36 and on the other hand in the limiting elements 42, 44, 46, have the advantage that the fluid 14 for treatment of the objects 12 can flow off to the side during rotation of the device 10.

To supply the objects 12 to the conveying device 10 designed as a rotation device, a belt conveyor 48 is provided in the embodiment using which the objects 12—as shown in FIG. 1 from left to right—are transferred to a slot—slot 40 in the embodiment. To ensure that the belt conveyor 48, which can also be replaced by another conveying element without departing from the invention, does not have to be adjusted in the area between the cheeks 30, 32 or 34, 36 during the transfer, a catch or slide 50 runs between the cheeks 30, 32 or 34, 36 and is adjustable both parallel to the conveying section of the conveyor 48 and of a conveyor 52 arranged down-stream of the rotation device 10, and preferably vertically or obliquely thereto, as arrows 54 and 55 are intended to make clear. This provides the possibility that whenever the catch 50 in the embodiment is moved to the left, and displaced parallel to the right along the conveyor 48, an object 12 provided thereon can be inserted into the slot 40, which must be aligned flush with the conveying section of the conveyor belt 48. To that end, the left-hand leg 56 shown in FIG. 1 must be arranged outside the object 12 present on the conveyor belt 48 and lowered in the direction of the conveyor belt sufficiently for the object 12 to be picked up by it and then inserted into the slot 40 by movement of the catch 50 in the direction of the arrow, to the right.

Accordingly, an object 12 can be transferred from the slot 38 onto the conveyor 52 when the slot 38 is aligned with the conveyor section and when the right-hand leg 58 of the catch 50 shown is adjusted, starting from the inner end of the slot 38, radially outwards in the transport direction 54, whereby the object 12 is transferred to the conveyor belt 52.

While the retaining elements 42, 44, 46 ensure that the objects 12 cannot move axially to an inadmissible extent inside the slots 38, 40, an endless belt 60 is provided as a safeguard against the objects 12 slipping out of the slots 38, 40 during their passage through the bath 16, said endless belt being guided by deflecting rollers 62, 64, 66, 68 peripherally along the circumferential edge of the disk or wheel 30 such that the slots 38, 40 are covered on the outside to the required extent. This is made clear by the views according to FIGS. 1 and 2. The endless belt 60 or an element achieving the same effect is moved synchronously with the rotation device such that during passage through the bath 14 a relative movement between the objects 12 and the securing element in the supporting area is prevented.

This ensures that whenever the rotation device 10, i.e. the disk elements 30, 32, 34, 36 in the embodiment are rotated counter-clockwise, the objects 12 cannot slip out of the slots 38, 40, while at the same time it is ensured that damage to or destruction of the objects 12 is prevented.

To ensure a clear-cut fixing of the revolving belt 60 or of equivalent elements, the disk element 30, 32, 34, 36 should have on the outer edge side a recess such as a groove serving as a guide for the belt 60 and ensuring that the latter cannot be removed uncontrolled.

The drives of the rotation device 10 and of the securing element or belt 60 can be synchronized by sufficiently known measures. Here the belt 60 can if necessary double as the driving means for the rotation device 10, which can be set in rotary motion by friction.

Instead of the catch 50, which has the advantage that during transfer of the objects 12 a contamination by fluid 14 such as chemicals via the transport mechanism is largely prevented, the transport belts 48, 52 can also be adjusted along their transport direction such that they project between the disk elements 30, 32 or 34, 36 to the necessary extent during transfer/removal, thus permitting direct insertion of objects 12 into the slots 38, 40 or their removal from these.

As the side view in FIG. 1 makes clear, the slots 38, 40 should be distributed evenly over the circumference of the disk elements 30, 32, 34, 36. An arc distance of 15° can be selected. With an appropriate slot arrangement and with the arrangement of five disk elements next to one another, i.e. comprising ten disk elements, a throughput of 1000 objects 12 per hour can be achieved, with the dwell duration of each object 12 in the bath 16 being about 3 minutes. By the selection of the rotation speed of the rotary or circular conveyor 10, i.e. of the disk elements 30, 32 and 34, 36, or by occupying the slots 38, 40 with objects 12, the dwell time in the fluid can be varied to the required extent.

The bath can have in the usual way a washing stage 70 and a drying stage 72 connected downstream. To that end, the objects 12 are passed in the cleaning stage 70 and in the drying stage 72 along conveying sections formed by sections 74, 76, 78, 80, 82, 84, which in turn can be endless conveyors such as belt conveyors but also walking-beam systems. Here the objects 12 are supported in the individual sections 74, 76, 78, 80 in various areas, i.e. the supporting points inside the individual part-sections differ from one another, thus ensuring that the objects 12 are completely cleaned and dried.

To ensure during cleaning and drying that the objects do not lift up off the respective transport belt, pressure rollers 86 act on the objects 12 in the direction of the conveyors 74, 76, 78, 80, 82, 84.

Figure 3:
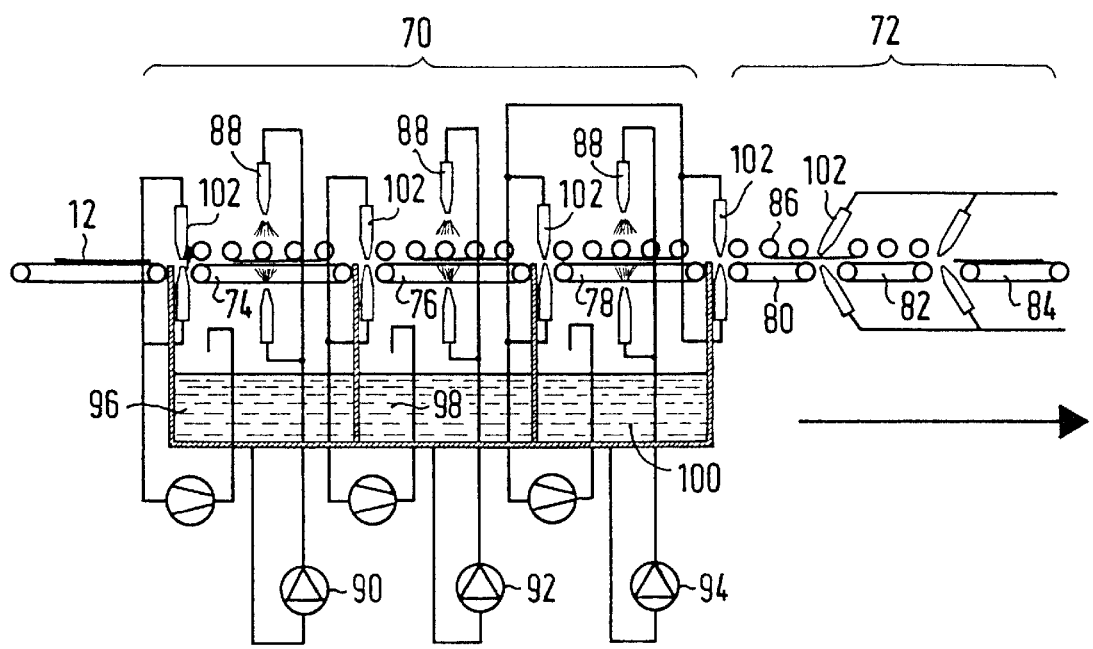
FIG. 3 shows a conveying section arranged downstream of the bath according to FIG. 1 for cleaning and drying of objects in a principle view.

In the embodiment in FIG. 3, the cleaning stage 70 comprises three areas 74, 76, 78 in which the objects 12 pass between spray nozzles 88 attached on both sides or through a fluid surge. In the sections 74, 76, 78, the fluid used is conveyed in a closed circuit 90, 92, 94. In the section associated with the conveying section 14 fully demineralized water can be used, in the subsequent section 76 tenside solution, and in the section 78 once again fully demineralized water. The respective supply tanks 96, 98, 100 should furthermore be supplied continuously with fresh and fully demineralized water. To save water, the supply tanks 96, 100 storing fully demineralized water should be connected in a cascade.

To prevent or reduce media contamination, the objects 12 to be treated are passed between the individual sections and also before the first section 74 of the cleaning stage 70 through suction nozzles or nozzle arrays 102 arranged on both sides of the objects, in order to extract fluid adhering to these objects using these nozzles. The necessary negative pressure to do so can be generated by suitable units, in particular by water jet pumps. For extraction of the tenside-containing washing solution, a diaphragm pump or rotary pump should be used to prevent foaming.

In the drying stage 52, the objects are passed between the conveying sections 80, 82, 84 through extraction devices such as air knives 102, as indicated purely in principle in FIG. 3.

Based on the teachings in accordance with the invention, objects, in particular disk-like objects such as metal sheets, glass panes, PCBs and ceramic substrates can be treated to the necessary extent—e.g. etched to remove oxide layers—and then cleaned and dried, thus providing a continuous process. As a result, a high throughput is possible, since it is possible with simple design means to convey the objects through the appropriate fluid bath.

What is claimed is:

1. A process for treatment of sheet objects, comprising the steps of:
    supplying the objects to a container containing a treatment fluid by a conveyor belt;
    rotating the objects through the fluid by means of at least one disk rotated about a rotational axis with alignment of the objects about the rotational axis, thereby treating the objects;
    retaining the objects during the treatment in slots of the at least one disk that are radial relative to the rotational axis, by a retaining element adjacent said rotation device and spaced therefrom along said axis of rotation, and further retaining the objects in a receptacle during passage through the fluid by a flexible securing element that is moved synchronously with the rotation device adjacent the rotation device at its periphery, the flexible securing element preventing relative movement of objects retained in the slots and the securing element;
    moving the treated objects translationally after the treatment; and
    supplying the treated objects to at least one washing and/or drying step.

2. Process according to claim 1, wherein the objects are supplied to the rotation device by the conveyor belt.

3. Process according to claim 1, wherein the objects are conveyed translationally in the at least one washing and/or drying step.

4. Process according to claim 1, wherein the objects are supported during their passage through the washing and/or drying step at different points in a transport section area.

5. Process according to claim 1, wherein the objects are subjected to pressure in the direction of their supports in the washing and/or drying step.

6. Process according to claim 1, wherein an object is retained during treatment by receptacles in two adjacent rotation devices mounted on a shaft.

7. Device for treatment of sheet objects, comprising:
    a container constructed and arranged for filling with fluid bath for treatment of the objects;
    a feed device arranged upstream of the bath;
    a conveying device passing the objects through the bath, the conveying device comprising at least one disk with radial slots therein constructed and arranged to receive the objects, and means for rotating the at least one disk about an axis of rotation;
    a securing element disposed within the container and extending in a peripheral area of the receptacles for retaining the objects in the slots, the securing element comprising a flexible element moving synchronously with the at least one disk, and preventing relative movement of objects retained in the slots and the securing element;
    a retaining element adjacent the at least one disk and spaced therefrom along the axis of rotation;
    a removal device arranged downstream of the container, and
    washing and/or drying means arranged downstream of the bath with associated transport means for conveying the sheet objects thereto.

8. Device according to claim 7, wherein the conveying means comprises at least two disks mounted on a shaft through the axis of rotation at a distance from one another said disks having slots opening radially towards the periphery.

9. Device according to claim 8, wherein the disks are circular disks.

10. Device according to claim 9; wherein the circular discs have penetrations.

11. Device according to claim 8, wherein the retaining element is mounted on the shaft adjacent each said disk.

12. Device according to claim 11, wherein the retaining element is connected to the respective disk by webs.

13. Device according to claim 7, wherein the flexible element is guided via deflecting rollers for circumferential contact with the disks.

14. Device according to claim 13, wherein the disks have a recess in their circumferential edge serving as a guide for the flexible element.

15. Device according to claim 7, wherein two rotation devices are mounted on the shaft, one retaining element each being provided between adjacent disks of successive rotation devices.

16. Device according to claim 7, wherein the feed device is a translational transport device.

17. Device according to claim 16 wherein the transport device is a belt conveyor.

18. Device according to claim 7, wherein the flexible element is a belt.

19. Device according to claim 7, additionally comprising at least one catch movable back and forth parallel to the conveying device, said catch running between the disks, said at least one catch comprising means for transferring objects from the feed device to the rotation device and/or from the rotation device to the removal device, said feed device and/or said removal device running in sections in the area between the disks during transfer or removal respectively of the objects.

20. Device according to claim 7, wherein the feed device and/or the removal device are arranged peripherally at a distance from the rotation device.

21. Device according to claim 7, wherein the washing and/or drying means comprise translational conveying devices for supporting the objects.

22. Device according to claim 7, wherein the objects are supported in different areas along their transport means in the cleaning and/or drying means.

23. Device according to claim 7, wherein lateral guide elements for the objects are arranged parallel to the transport means.

24. Device according to claim 7, wherein the objects in the transport means of the cleaning and/or drying means are subjected to pressure in the direction of the conveying device.

25. Device according to claim 7, wherein the transport means of the cleaning means comprises spray nozzles and/or surge-cleaning devices arranged directed toward the objects, and a circuit for containing cleaning fluid.

26. Device according to claim 25, wherein for identical cleaning fluids, a plurality of circuits are connected in cascades.

27. Device according to claim 7, additionally comprising suction devices disposed inside the cleaning means and/or upstream and downstream thereof, for extraction of fluid from the objects.

28. Device according to claim 7, wherein the drying means comprises air nozzles directed toward the objects.

* * * * *